(12) United States Patent
Rezeanu

(10) Patent No.: US 7,516,280 B1
(45) Date of Patent: Apr. 7, 2009

(54) PULSED ARBITRATION SYSTEM AND METHOD

(75) Inventor: Stefan-Cristian Rezeanu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 656 days.

(21) Appl. No.: 11/079,960

(22) Filed: Mar. 15, 2005

Related U.S. Application Data

(60) Provisional application No. 60/557,765, filed on Mar. 30, 2004.

(51) Int. Cl.
G06F 12/00 (2006.01)
G06F 13/36 (2006.01)

(52) U.S. Cl. ...................................... 711/149; 710/309
(58) Field of Classification Search ................. 711/149; 710/309
See application file for complete search history.

(56) References Cited

U.S. PATENT DOCUMENTS

| | | | |
|---|---|---|---|
| 4,535,428 A | 8/1985 | Furman | |
| 4,554,645 A | 11/1985 | Furman | |
| 4,616,347 A | 10/1986 | Bernstein | |
| 4,742,487 A | 5/1988 | Bernstein | |
| 4,862,297 A * | 8/1989 | Fukami et al. | ................. 360/53 |
| 4,901,264 A * | 2/1990 | Hayashi | ..................... 708/250 |
| 5,036,491 A | 7/1991 | Yamaguchi | |
| 5,276,842 A | 1/1994 | Sugita | |
| 5,289,427 A | 2/1994 | Nicholes | |
| 5,384,734 A | 1/1995 | Tsujihashi | |
| 5,398,211 A | 3/1995 | Willenz | |
| 5,502,683 A | 3/1996 | Marchioro | |
| 5,737,569 A | 4/1998 | Nadir | |
| 5,768,211 A | 6/1998 | Jones | |

* cited by examiner

*Primary Examiner*—Hyung S Sough
*Assistant Examiner*—Mehdi Namazi

(57) ABSTRACT

A pulsed arbitration system has a partial-address coincidence detector with a partial-address collision flag as an output. An active global word line detector and disable pulse generator receives the partial-address collision flag as well as a decoded row address and an internal write pulse as an input, and generates a disable pulse for the interfering global word line of the colliding reading port.

20 Claims, 5 Drawing Sheets

PULSED ARBITRATION SYSTEM AND METHOD

RELATED APPLICATIONS

The present invention claims priority on provisional patent application Ser. No. 60/557,765, filed on Mar. 30, 2004, entitled "Pulse Arbitration with Partial Address Coincidence Detection in Synchronous Multi-Port Memories".

FIELD OF THE INVENTION

The present invention relates generally to the field of electronic memories and more particularly to a pulsed arbitration system and method.

BACKGROUND OF THE INVENTION

Memory circuits with a number of access ports have become very popular and widely used in data communications and processing systems. One of the challenges associated with multi-port memories is how to resolve the situation where at least two ports attempt to access the same memory location at the same time, with at least one of them attempting a write. This situation can result in corruption of the stored data or corruption of the read-out data. A number of arbitration schemes have been proposed. One of the problems with prior art solutions is that they were developed to target two port memories. One arbitration solution is to use a priority scheme that gives priority to one of the ports. A flow chart illustrating the most common system, including the priority scheme solution, is shown in FIG. 1. The process starts, step 10, by determining if two ports are attempting to access the same cell at step 12. When the two ports are not attempting to access the same cell, the process waits for the beginning of the next cycle at step 14, and then repeats. When the two ports are attempting to access the same cell, the arbitration condition is latched favoring the priority channel at step 16. Next, the predecoded lines of the interfering port are inactivated for at least the duration of the overlapping addresses at step 18. This solution results in significantly limiting the performance of the non-priority or lower priority ports. Another problem found in the prior art is that the arbitration system locks out ports when there are multiple reads and no write operations. Yet another problem with some of the prior art solutions is that they block the other port(s') array access for a complete arbitration-winning-port's clock cycle. Since the port clocks are generally asynchronous, the arbitration-winning-port's clock may have a significantly longer clock cycle than the other port(s) attempting to access the same memory cell. As a result, the losing port(s) may be blocked for multiple clock cycles, significantly reducing its/their performance.

Thus, there exists a need for a multi-port arbitration scheme that does not have priority channels, allows multiple simultaneous reads and does not block a port's memory access for any longer than is necessary.

SUMMARY OF INVENTION

A pulsed arbitration system that overcomes these and other problems has a partial-address coincidence detector with a partial-address collision flag as an output. An active global word line detector and disable pulse generator receives the partial-address collision flag as well as a decoded row address and an internal write pulse as an input. The partial-address coincidence detector may have a number of partial port addresses as input signals. The partial port addresses do not include any global word line addresses. The partial-address coincidence detector may include a read/write detector. An output pulse of the active global word line detector and disable pulse generator may have a pulse width related to a writing port's internal write pulse width and may deactivate the interfering global word line of the interfering port(s). A trailing edge of the output pulse may deactivate the partial-address collision flag output. The partial-address coincidence detector may detect a collision between two or more ports.

In one embodiment, a method of pulsed arbitration includes the steps of determining if a partial-address coincidence exists between a number of ports. When the partial-address coincidence exists between the ports, a partial-address collision flag and a disable pulse may be generated. In one embodiment it is determined if one of the ports is attempting a write operation. When one of the ports is attempting the write operation and the partial-address coincidence exists, the disable pulse may be generated. In another embodiment, it is determined if two or more of the ports are attempting a write. When two or more of the ports are attempting to write, all attempted write operations are blocked. In one embodiment, an interfering global word line is determined. The disable pulse may be applied to the interfering global word line. A pulse width of the disable pulse may be determined. A delay period of the disable pulse may be determined.

In one embodiment, a pulsed arbitration system includes a partial-address coincidence detector with a partial-address collision flag as an output. A disable circuit is coupled to the partial-address coincidence detector. The partial-address coincidence detector may have a write detector. The partial-address coincidence detector may not be coupled to any global word lines. The disable circuit may include an active global word line detector. The disable circuit may include a disable pulse delay circuit. The disable circuit may include a disable pulse width generator.

DETAILED DESCRIPTION OF THE DRAWINGS

The pulsed arbitration system and method of present invention uses a partial-address coincidence detector. The partial-address coincidence detector is faster and requires fewer gates that a full coincidence detector. The partial-address coincidence detector has a read/write detector so that two or more colliding ports all attempting to just read a common memory location will not be blocked. The partial-address coincidence detector is coupled to an active global word line detector and disable pulse generator that generates a disable pulse for about the length of the writing port's internal write pulse width. As a result, the "interfering" (reading) ports are only blocked for a part of the write cycle.

Figure 1:
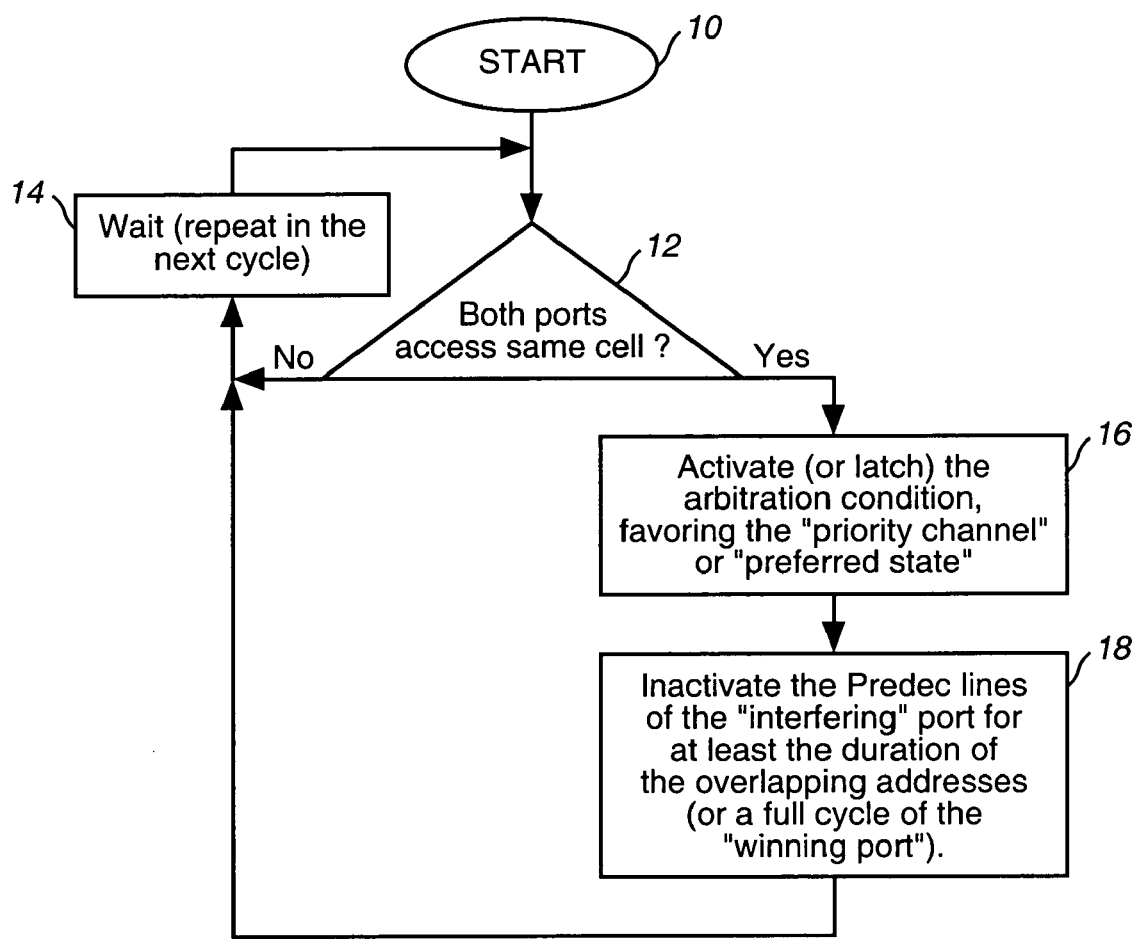
FIG. 1 is a flow chart of the steps used in a previous arbitration circuit solution.
Figure 2:
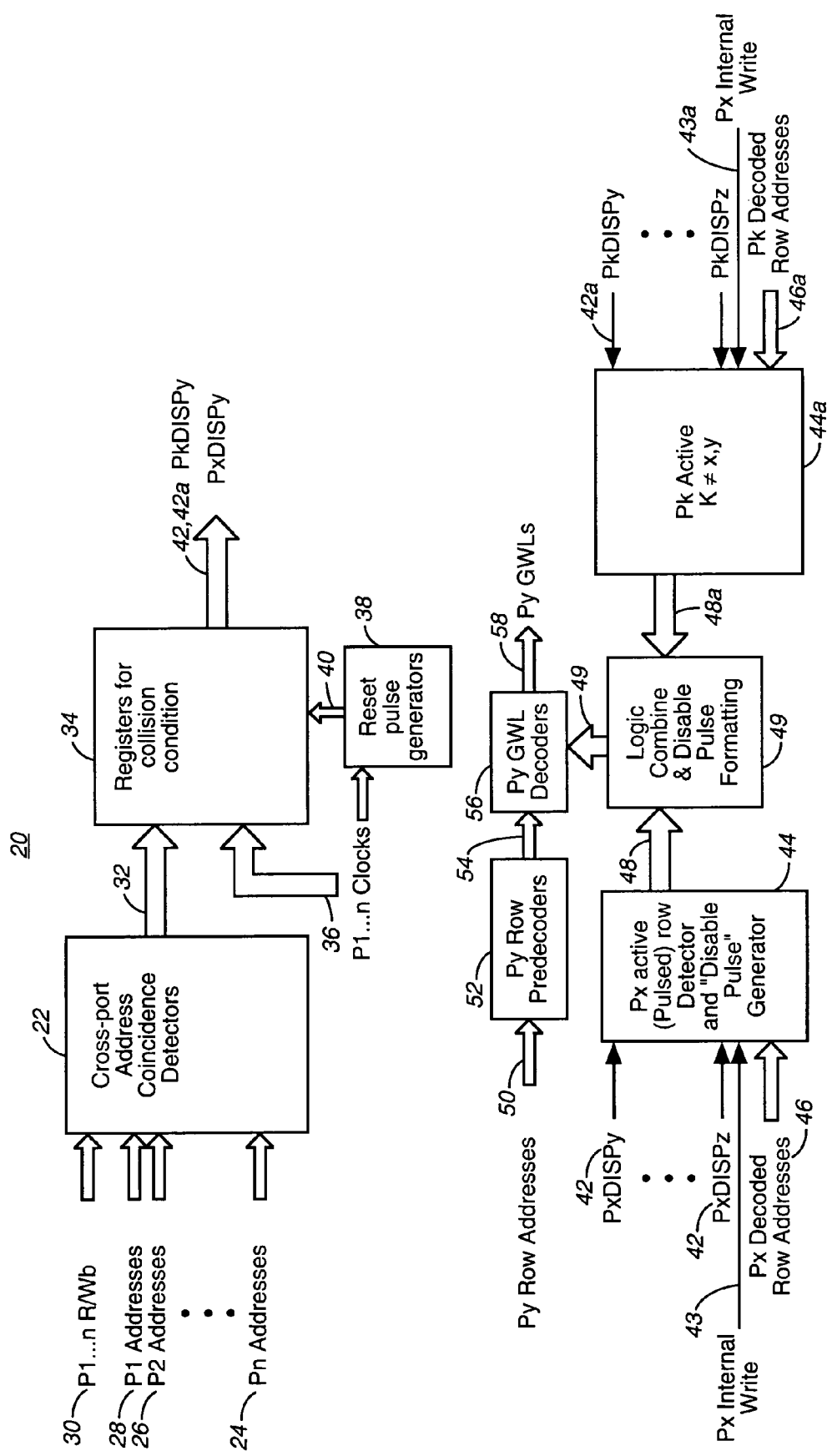
FIG. 2 is a block diagram of a pulsed arbitration system in accordance with one embodiment of the invention.

FIG. 2 is a block diagram of a pulsed arbitration system 20 in accordance with one embodiment of the invention. A partial-address coincidence detector 22 has a number of inputs coupled to a plurality of partial addresses 24, 26, 28 from a plurality of ports. Note that the partial addresses 24, 26, 28 do not include any of the global word lines. The partial-address coincidence detector 22 also has a read/write input 30. Note that the read/write input 30 is a read/write input for all the ports. The output 32 of the partial-address coincidence detector 22 is coupled to a plurality of collision registers 34. The collision registers 34 are clocked by the port clocks 36 of the appropriate port. A plurality of reset pulse generators 38 have a reset pulse output 40 coupled to an asynchronous reset of the plurality of registers 34. The output 42 of each of the plurality of registers 34 is a port "x" disables port "y", and the outputs 42a of each of the plurality of registers 34 is a port "k" disables port "y".

The output signals 42 and 42a form the inputs to the active global word line detector and disable pulse generator circuits 44 and 44a. The active global word line detector and disable pulse generators 44 and 44a also receive the port "x" and port "k" (k≠x, y) internal write pulses 43 and 43a, as well as the decoded row address 46 and 46a, which may be the writing ports' row address. The outputs 48 and 48a of the active global word line detector and disable pulse generators 44 and 44a are disable pulses. The outputs 48 and 48a of the active global word line detector and disable pulse generators 44 and 44a are coupled to a logic combine and disable pulse formatting block 47, whose output is a port "y" global word line disable pulse 49. The port "y" row address 50 is coupled to a row predecoder 52. The predecoded port "y" address 54 is coupled to the port "y" global word line decoder 56. In the case of an actual collision, the reading port's ("y") active global word line (part of the port "y" global word line bus 58) is inactivated during the disable pulse 49, generated due to a write initiated by a port "y" or "k".

Figure 3:
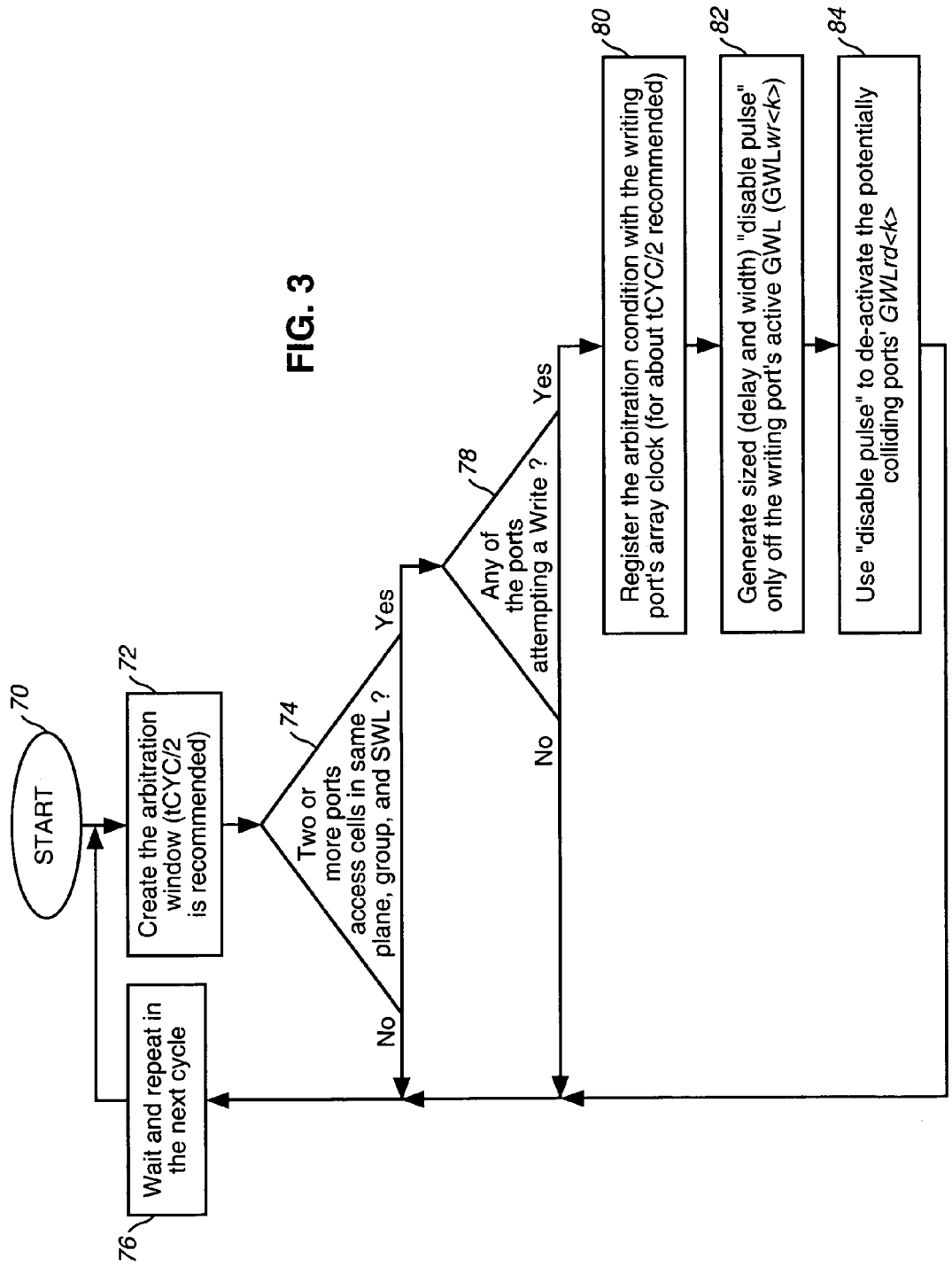
FIG. 3 is a flow chart of the steps used in a pulsed arbitration method in accordance with one embodiment of the invention.

FIG. 3 is a flow chart of the steps used in a pulsed arbitration method in accordance with one embodiment of the invention. The process starts, step 70, by creating the arbitration window at step 72. The recommended arbitration window is around one half of the memory's cycle time. Next it is determined if two or more of the ports are attempting to access the same cell(s)—i.e., in the same plane, group and sub-word line at step 74. This is determined by the partial-address coincidence detector 22 of FIG. 2. If two or more of the ports are not attempting to access cell(s) in the same plane, group and sub-word line, the processing waits at step 76 for the next cycle. If two or more of the ports are attempting to access cell(s) in the same plane, group and sub-word line, then it is determined at step 78 if any of the ports are attempting a write operation. This is determined by the partial-address coincidence detector 22 of FIG. 2. If none of the ports are attempting a write operation, processing proceeds to step 76. If any of the ports is attempting a write operation, then the arbitration condition is registered with the writing port's array clock at step 80. This operation is performed by the registers 34 of FIG. 2. Note that the condition is only registered during the arbitration time window. A sized (delay and width) "disable pulse" is generated off of the writing port's active global word line at step 82. This function is performed by the active global word line detector and disable pulse generator 44 (or 44a) of FIG. 2. The disable pulse is used to de-activate the potentially colliding ports' global word lines at step 84. The process then proceeds to step 76 and repeats.

Figure 4:
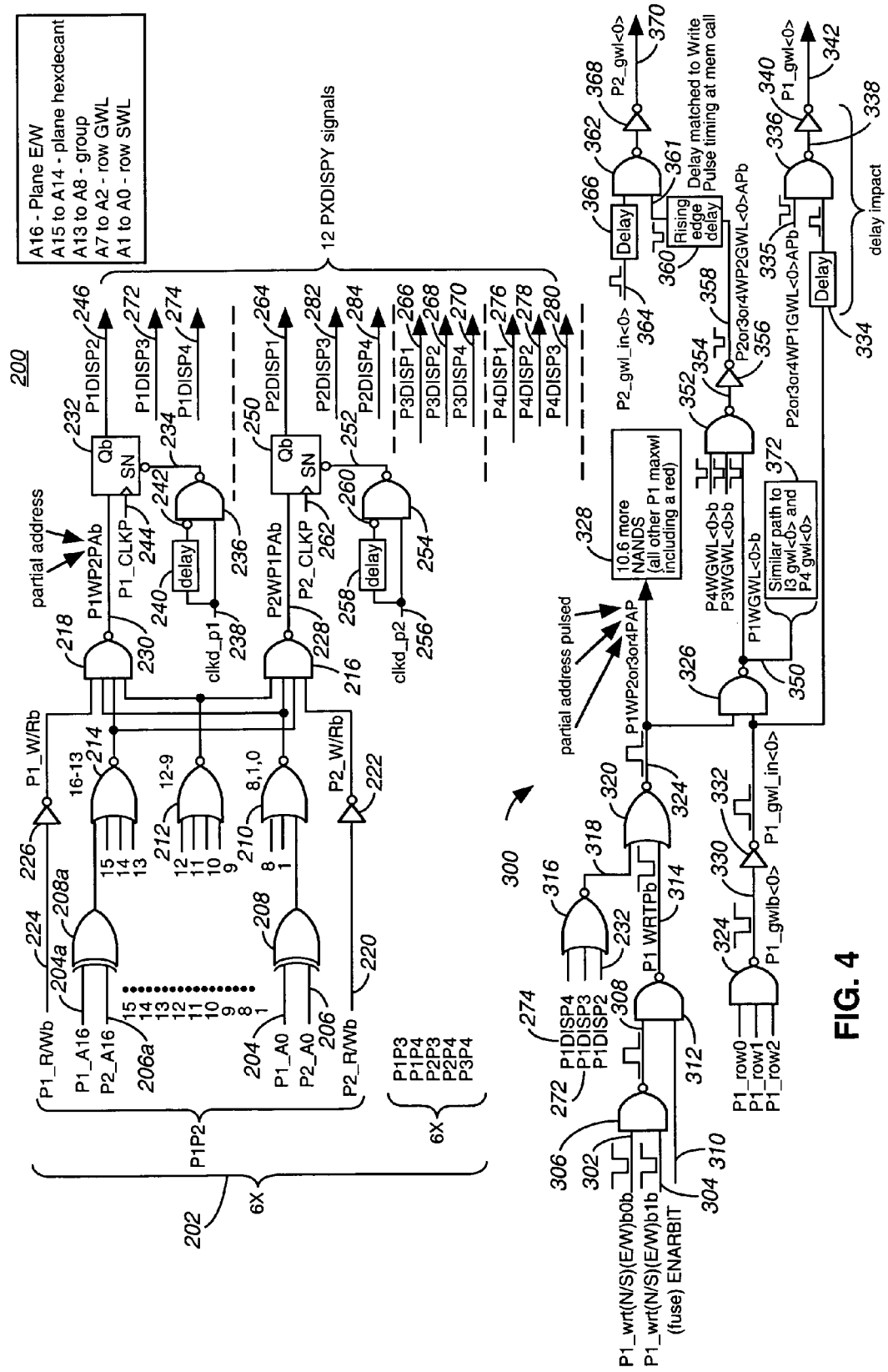
FIG. 4 is a symbolic logic diagram of a pulsed arbitration system in accordance with one embodiment of the invention.

FIG. 4 is a symbolic logic diagram of a pulsed arbitration system 200 in accordance with one embodiment of the invention. The system 200 illustrates a quad port implementation, and thus has six partial-address coincidence detector circuits 202. The example shown in the figure assumes a seventeen bit address bus. The zero bits 204, 206 from ports one and two are coupled to an XOR gate 208. Similarly, the sixteenth bits 204a, 206a from ports one an two are coupled to an XOR 208a. Note that a similar circuit exists for bits 1 and 8-15. The bits 2-7 are global word line bits and are not compared in the partial-address coincidence detector 202. The outputs of the XOR gates (208, 208a, and all the other ones mentioned above) are coupled to three NOR gates 210, 212, 214. The NOR gate 210 combines the comparison of the bits 0, 1, and 8, the NOR gate 212 combines the comparison of the bits 9-12, and the NOR gate 214 combines the comparison of the bits 13-16. The outputs of NOR gate 210, 212 & 214 form the input to NAND gate 216 and NAND gate 218. NAND gate 216 is coupled to a port two read/write signal 220 through an inverter 222. NAND gate 218 is coupled to a port one read/write signal 224 through an inverter 226. In the example, the outputs of the NAND gates 216, 218 are the partial-address coincidence detectors output. Note that the partial-address coincidence detector 202 described so far is for two ports and includes the read/write detector. When four ports are used (the quad port case), five more partial-address coincidence detectors are needed in order to include all the six possible combinations of the ports. Note that both the address and write signals have been previously registered for a full clock cycle (generally the addresses are registered around the middle of the previous clock cycle). When there is a partial-address coincidence between these ports and port two is attempting a write then the output 228 is true (active low disable signal). The output 230 activates if there is a partial-address coincidence between port one and port two when port one is attempting a write.

The output 230 is a "port one writes port two's partial-address" signal and forms the input to a flip flop 232. The other input (an active low reset pulse 234) to the flip flop 232 is the output of a NAND gate 236. The inputs to the NAND gate 236 are an arbitration-window-delayed version of the port one clock 238 and the output 242 of a delay circuit 240 that delays the port one clock 238 and sets the duration of the reset pulse 234. Note that the second input 242 of the NAND gate 236 is inverted. The flip flop 232 is strobed by the port one clock 244. The delay circuit 240 and the NAND gate 236 form a reset pulse generator circuit for the flip flop 232. The complemented output of the flip flop 246 (Qb) is a port one disables port two signal which is always reset (through an asynchronous set operation performed by the reset pulse 234) after the arbitration window elapses.

The output 228 is a "port two writes port one's partial-address" signal and forms the input to a flip flop 250. The other input (an active low reset pulse 252) to the flip flop 250 is the output of a NAND gate 254. The inputs to the NAND gate 254 are an arbitration-window-delayed version of the port two clock 256 and the output 260 of a delay circuit 258 that delays the port two clock 256 and sets the duration of the reset pulse 252. Note that the second input 260 of the NAND gate 254 is inverted. The flip flop 250 is strobed by the port two clock 262. The delay circuit 258 and the NAND gate 254 form a reset pulse generator circuit for the flip flop 250. The complemented output of the flip flop 264 (Qb) is a port two disables port one signal which is always reset (through an asynchronous set operation performed by the reset pulse 252) after the arbitration window elapses. Note that there are similar circuits that generate a port three disables port one signal 266, a port three disables port two signal 268, a port three disables port four signal 270, a port one disables port three signal 272, a port one disables port four signal 274, a port four disables port one signal 276, a port four disables port two signal 278, a port four disables port three signal 280, a port two disables port three signal 282, and a port two disables port four signal 284. This example assumes a four port device (quad port); however, the concept can be extended to any number of ports and any size address space.

In addition, the system will block all write operations if two or more writes occur targeting the same address location. For instance, both the port one disable port two signal 246 and the port two disable port one signal 264 will be valid if port one and port two are attempting to write to the same memory cell and both operations will be blocked. An arbitration control scheme 300 for the disable signals 246, 264, 266, 268, 270, 272, 274, 276, 278, 280, 282, 284 has the byte zero port one internal write pulsed signal 302 and the byte one port one internal write pulsed signal 304 forming the inputs to a NAND gate 306. This assumes that two bytes are going to each block/group of the memory array, for illustration of the general concept. The output 308 of the NOR gate 306 and enable arbitration signal 310 form the inputs to a NAND gate 312. When the enable arbitration signal 310 is off or false (i.e., at logic__0), then the output 314 (P1_WRTPb) of the NAND gate 312 is at logic__1 and blocks any of the signals port one disable port two 232, port one disable port three 272, and port one disable port four 274 that may be active. The output 314 is combined with the output 318 of NOR gate 316 in the NOR gate 320. The output 324 of NOR gate 320 is called P1WP20r30r4PAP (standing for Port1 Writes Port2's or Port3's or Port4's Partial Address Pulsed). The "pulsed" in the end of signal names conveys the information related to the shape of the specific signal when activated, and the majority of the pulsed signals have a width related to the specific port's internal write width. The output 324 is coupled to a NAND gate 326 (associated with global word line index <0> in the example) as well as sixty five similar NAND gates 328, in order to control all the other global word line indices (including two that are redundant).

Port one predecoded signals (assumed pulsed, and called "row 0, 1, and 2", which is typical for the example case of 6 global word line row addresses) are combined in a NAND gate 328, whose output 330 is the port one global word line bar index <0> output. The output 330 is coupled to the NAND gate 326 through the inverter 332. The output 330 is also coupled to a delay circuit 334. The output of the delay circuit 334 is an input of NAND gate 336. The other input 335 of NAND gate 336 is the P20r30r4WP1GWL<0>APb pulsed signal (a low-going pulse is present when P2 or P3 or P4 attempt to write the same cell accessed by P1's Global Word Line index <0> Address). The output 338 is coupled to an inverter 340. The output 342 of the inverter 340 is P1's global word line index <0> (bit zero of its global word line bus).

The output 350 of NAND gate 326 (P1WGWL<0>b) is coupled to NAND gate 352. The NAND gate 352 also has similar inputs controlled by P3 and P4: P3WGWL<0>b and P4WGWL<0>b (low-going pulses, if active, indicating that the respective port is attempting to write on its own global word line index <0>). The output 354 of NAND gate 352 is inverted by inverter 356 to form the signal 358: P1or30r4WP2GWL<0>APb pulsed signal (a low-going pulse is present when P1 or P3 or P4 attempt to Write the same cell accessed by P2's Global Word Line index <0> Address). This signal 358 is coupled to a rising edge delay circuit 360, whose delay is matched to the actual write pulse timing at the memory cell level. The output 361 of the delay circuit 360 forms an input of the NAND gate 362. The other input is P2_gwl_in <0> (P2's global word line index <0>) signal 364, which is P2's counterpart of P1's signal output of the 332 inverter. This signal 364 is delayed by the delay circuit 366, whose role is to synchronize the regular global word line pulse position with the potential position of the writing port's disabling pulse. The output of the NAND gate 362 is coupled to an inverter 368 and the output 370 of the inverter is P2's global word line index <0> (bit zero of its global word line bus). Note that similar circuits 372 are coupled to the output 350 of the NAND gate 326. The outputs 342 and 370 are part of the pulsed global word line signals whose pulse can be blocked (by the simultaneously writing port) to prevent the read access to the memory location.

Figure 5:
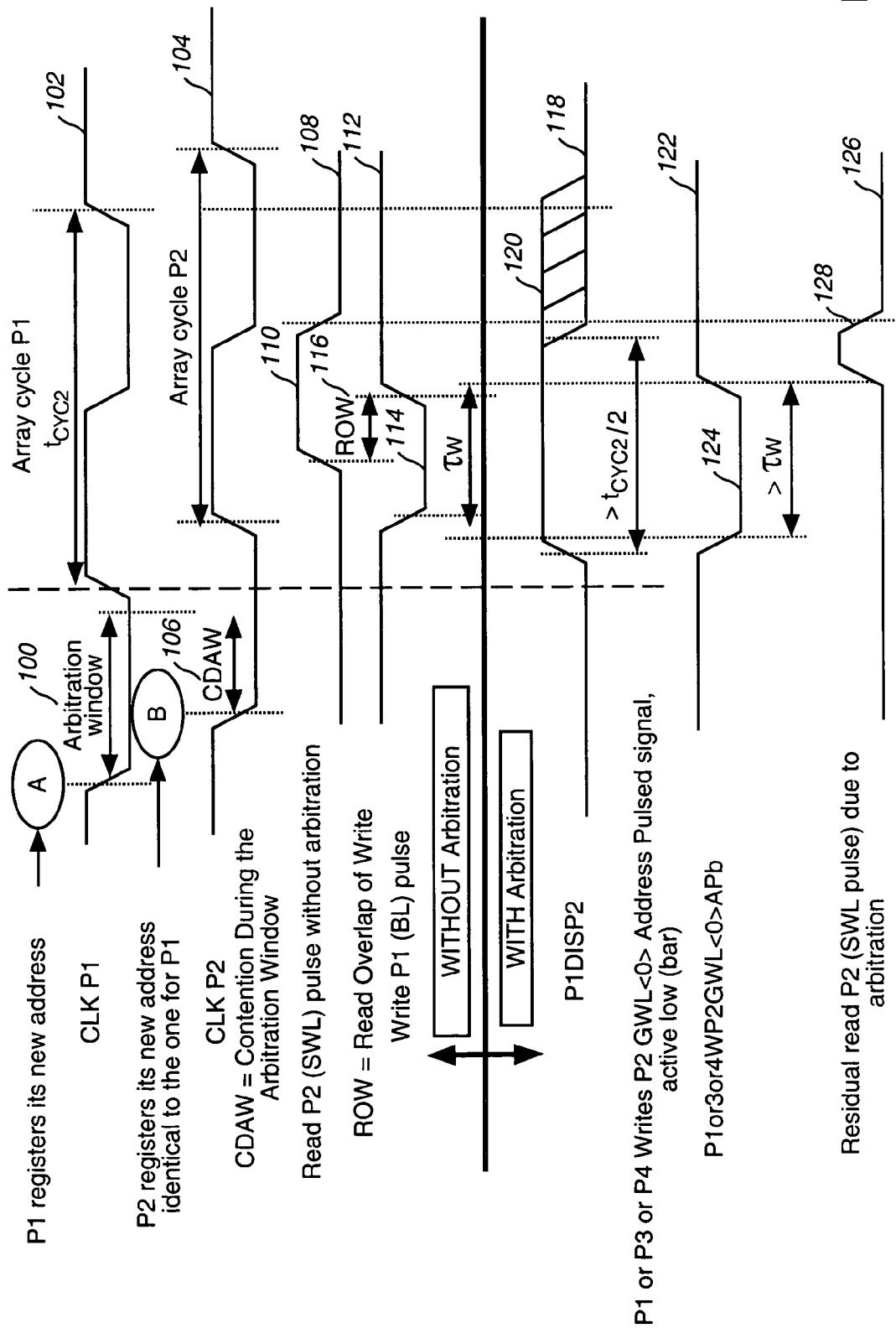
FIG. 5 is a signaling diagram for a pulsed arbitration method in accordance with one embodiment of the invention.

FIG. 5 is a signaling diagram for a pulsed arbitration method in accordance with one embodiment of the invention. For illustration purposes the colliding ports are assumed to be of the same frequency and the address and write pulses at the cell level are depicted as having equal widths. The arbitration window 100 is slightly smaller than "tCYC/2" (where tCYC2 is the duration of the full clock cycle corresponding to the maximum frequency), namely by the propagation through the partial-address coincidence detector logic and set-up time of a register for collision conditions—which in one exemplary embodiment may comprise a latch or a register. This means that the arbitration pulse width is equal to a write pulse plus a margin of error.

The first trace 102 shows the clock of port one (P1). The second trace 104 shows the clock of port two and the contention during the arbitration window (CDAW) 106. The third trace 108 shows the P2 read (Sub-Word Line: SWL) pulse 110 in the case when arbitration is not used. The fourth trace 112 shows the write (at the Bit Line: BL-level) pulse 114 for P1 and the read overlap of write (ROW) duration 116. If this is allowed to occur it can result in an unsuccessful write operation. The next traces show the difference when arbitration is enabled. The fifth trace 118 shows the port one disables port two registered arbitration (or "collision detection") pulse 120. Note that while the preferred pulse width is tCYC/2, it may practically have a different pulse width shown by the multiple fall times of the pulse 120. In other words, the shaded area in the P1 DISP2 waveform illustrates the possible active range of the reset pulse that should arrive after the completion of the arbitration event. The sixth trace 122 is the P1 or P3 or P4 global word line disable pulse 124 (corresponding to signal 358 in FIG. 4). The seventh trace 126 is the residual read (SWL) pulse 128 for P2, cut short due to the arbitration scheme. In the case shown with activated arbitration, the result of the read is not guaranteed—as illustrated in the diagram by the residual read port's (P2) SWL pulse. However, the arbitration protects the write operation. In the example, the user is violating the tCCS (clock-to-clock set-up time) data sheet specification. In order to have a valid read, after a write from another port at the same address, the user has to wait at least tCCS, which is usually slightly shorter than the tCYC2. In one exemplary embodiment, a device with a tCYC2 of 6 ns would have a tCCS of around 5 ns, and the internal write BL pulse width (TW) and address pulse duration would be approximately 2 ns. In a situation where the read request falls outside the write, there is a case where although a potential arbitration condition is registered or latched, the "colliding" port's internal (SWL) read pulse will not be cut short (because typically TW is significantly narrower than the arbitration window). This would be visible in a situation where the reading port's (P2) clock slides to the right with respect to the writing port's (P1) clock, to the point where there is no read overlap of write (ROW) but there is still a contention during the arbitration window (CDAW).

Thus there has been described a pulsed arbitration system and method of present invention that uses a partial-address coincidence detector. The partial-address coincidence detector is faster and requires fewer gates than a full coincidence detector. The partial-address coincidence detector has a read/write detector so that two or more ports all attempting to just read the same memory location will not be blocked. The partial-address coincidence detector is coupled to an active global word line detector and disable pulse generator block that generates a disable pulse for about the width of the writing port's internal write pulse duration. As a result, the other (reading) colliding ports are only blocked for a part of their read cycle.

The methods described herein can be implemented as computer-readable instructions stored on a computer-readable storage medium that when executed by a computer will perform the methods described herein.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A pulsed arbitration systems comprising:
   a partial-address coincidence detector having a partial-address collision flag as an output; and
   an active global word line detector and disable pulse generator receiving the partial-address collision flag as well as a decoded row address and an internal write pulse as an input.

2. The system of claim 1, wherein the partial-address coincidence detector has a plurality of partial port addresses as input signals.

3. The system of claim 2, wherein the plurality of partial port addresses does not include any global word line addresses.

4. The system of claim 1, wherein the partial-address coincidence detector includes a read/write detector.

5. The system of claim 1, wherein an output pulse of the active global word line detector and disable pulse generator has a pulse width related to a writing port's internal write pulse width.

6. The system of claim 5, wherein a trailing edge of the output pulse deactivates the partial-address collision flag output.

7. The system of claim 1, wherein the partial-address coincidence detector detects a partial-address collision between two or more ports.

8. A method of pulsed arbitration, comprising:
   (a) determining if a partial-address coincidence exists between a plurality of ports;
   b) when the partial-address coincidence exists between the plurality of ports, generating a partial-address collision flag and potentially a disable pulse.

9. The method of claim 8, wherein (b) further includes:
   (b1) determining if one of the plurality of ports is attempting a write operation;
   (b2) when one of the plurality of ports is attempting the write operation and the partial; address coincidence exists, generating the disable pulse.

10. The method of claim 8, wherein (a) further includes:
    (a1) determining if two or more of the plurality of ports are attempting a write;
    (a2) when two or more of the plurality of ports are attempting the write, blocking all attempted operations.

11. The method of claim 8, further including:
    (c) determining an interfering global word line.

12. The method of claim 11, further including:
    (d) applying the disable pulse to the interfering global word line.

13. The method of claim 8, wherein (b) further includes:
    (b1) determining a pulse Width of the disable pulse.

14. The method of claim 13, further including:
    (b2) determining a delay period of the disable pulse.

15. A pulsed arbitration system, comprising:
    a partial-address coincidence detector having a partial-address collision flag as an output; and
    a disable circuit coupled to the partial-address coincidence detector.

16. The system of claim 15, wherein the partial-address coincidence detector has a write detector.

17. The system of claim 16, wherein the partial-address coincidence detector is not coupled to any global word lines.

18. The system of claim 17, wherein the disable circuit includes an active global word line detector.

19. The system of claim 18, wherein the disable circuit includes a disable pulse delay circuit.

20. The system of claim 19, wherein the disable circuit includes a disable pulse width generator.

* * * * *